(12) United States Patent
Alejano et al.

(10) Patent No.: US 6,980,478 B1
(45) Date of Patent: Dec. 27, 2005

(54) ZERO-ENABLED FUSE-SET

(75) Inventors: Frank Alejano, Allen, TX (US); Brian J. Ladner, Plano, TX (US); Timothy B. Cowles, Boise, ID (US); Todd A. Merritt, Boise, ID (US); Danial S. Dean, Meridian, ID (US); Paul M. Prew, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/931,735

(22) Filed: Sep. 1, 2004

(51) Int. Cl.$^7$ .............................................. G11C 7/00
(52) U.S. Cl. ............... 365/225.7; 365/200; 365/230.01
(58) Field of Search ........................... 365/225.7, 200, 365/230.01

(56) References Cited

U.S. PATENT DOCUMENTS

| | | | | |
|---|---|---|---|---|
| 5,247,481 A | * | 9/1993 | Conan | .................... 365/200 |
| 5,706,292 A | * | 1/1998 | Merritt | .................... 714/710 |
| 6,426,911 B1 | * | 7/2002 | Lehmann et al. | ........ 365/225.7 |
| 6,538,939 B1 | * | 3/2003 | Vollrath et al. | ............. 365/201 |

* cited by examiner

*Primary Examiner*—Vu A. Le
(74) *Attorney, Agent, or Firm*—Williams Morgan & Amerson, P.C.

(57) ABSTRACT

A method, apparatus, and system are provided for implementing a zero-enabled fuse system. An apparatus includes a first set of fuses for activating a first memory portion, and a second set of fuses for activating a second memory portion. The apparatus also includes a controller to control an operation of the first and second set of fuses. The controller is adapted to determine whether a zero address memory location relating to the first memory portion is to be activated based upon an enable fuse. The controller is adapted to also perform a check to determine whether the second set of fuses has been previously activated.

50 Claims, 11 Drawing Sheets

ZERO-ENABLED FUSE-SET

BACKGROUND OF THE INVENTION

1. Field of the Invention

This invention relates generally to a semiconductor memory device, and, more specifically, to provide a zero-enabled fuse-set to effectuate a reduced number of fuses in a semiconductor memory device.

2. Description of the Related Art

Modern integrated circuit devices are comprised of millions of semiconductor devices, e.g., transistors, formed above a semiconductor substrate, such as silicon. These devices are very densely packed, i.e., there is little space between them. Similarly densely packed electrically conducting lines may also be formed in the semiconductor substrate. By forming selected electrical connections between selected semiconductor devices and selected conducting lines, circuits capable of performing complex functions may be created. For example, bits of data may be stored by providing electrical current to a plurality of bit lines and an orthogonal plurality of word lines that may be electrically coupled to one or more capacitors in a semiconductor memory.

The semiconductor memory may be a dynamic random access memory, a flash memory, and the like. The semiconductor memory typically comprises an array of memory cells, address decoding circuitry for selecting one, or a group, of the memory cells for reading or writing data, sensing circuitry for detecting the digital state of the selected memory cell or memory cells, and input/output lines to receive the sensed data and convey that information for eventual output from the semiconductor memory. In many cases, the array of memory cells will be sub-divided into several sub-arrays, or subsets, of the complete collection of memory cells. For example, a semiconductor memory having 16 megabits ($2^{24}$ bits) of storage capacity may be divided into 64 sub-arrays, each having 256K ($2^{18}$) memory cells.

Flash memory (sometimes called "flash RAM") is a type of non-volatile memory that can be erased and reprogrammed in units of memory called blocks. Other types of memory may be erased and rewritten in smaller units, such as units at the byte level, which is more flexible, but slower than the block operations of flash memory. Flash memory is commonly used to hold control code such as the basic input/output system (BIOS) in a personal computer. When BIOS needs to be changed (rewritten), the flash memory can be written in block (rather than byte) sizes, making it faster to update. Applications employing flash memory include digital cellular phones, digital cameras, LAN switches, computers, digital set-up boxes, embedded controllers, and other devices.

In various semiconductor devices such as memory devices, redundant elements are generally implemented for activation of these elements under certain conditions. For example, during testing or quality analysis performed on a device, various portions of the device may be found to have defects. Often, certain devices may have a limited number of defects wherein if a substantially small number of the defects are corrected, the memory device may not have to be scrapped, thereby enhancing yield during production of semiconductor devices. Memory devices are generally manufactured to have redundant memory elements that correspond to primary memory elements. In the event that a primary memory element is found to be defective, a corresponding redundant element is invoked for correcting the defect.

Generally, a dedicated match circuit is assigned for each of the redundant elements in a device. For example, a dedicated match circuit may exist for both the redundant row and the redundant column corresponding to memory locations in the memory device. These match circuits, which are designed to perform decoding of memory locations, may have spare elements, each of which may require associated fuse banks to enable the element during a repair procedure. State-of-the-art implementation of redundant elements generally involves matching addresses, where enable bits relating to the redundant elements are stored as discreet fuses within a fuse bank. Each fuse in the fuse bank may be dedicated to a corresponding redundant element. Each fuse bank defines the element match address in a binary form with a fixed number of fuses. Each fuse bank also contains one additional fuse to enable the bank to match a predetermined repair and memory address in a primary array of memory.

One problem with state-of-the-art redundancy systems includes the fact that a plurality of storage fuses are used to uniquely associate a given fuse bank with its repair address. These additional fuse elements call for the use of larger than desired use of semiconductor real estate. Additionally, each fuse may consume a finite amount of current. Therefore, state-of-the-art redundancy systems call for an inefficient amount of current usage and device layout real estate. For example, in a memory device of one gigabyte, implementation of state-of-the-art fuse bank systems call for an extra fuse (i.e., enable fuse) for each fuse bank. For example, for a group of 2000 fuse banks, the state-of-the-art fuse bank systems call for an additional 2000 extra fuses. This causes a use of undesirable amount of space that is required to accommodate the extra fuses, as well as adverse power consumption effects.

The present invention is directed to overcoming, or at least reducing, the effects of, one or more of the problems set forth above.

SUMMARY OF THE INVENTION

In one aspect of the instant invention, a device is provided for implementing a zero-enabled fuse system. The device of the present invention includes a first set of fuses for activating a first memory portion, and a second set of fuses for activating a second memory portion. The device also includes a controller to control an operation of the first and second set of fuses. The controller is adapted to determine whether a zero address memory location relating to the first memory portion is to be activated based upon an enable fuse. The controller is adapted to also perform a check to determine whether the second set of fuses has been previously activated.

In another aspect of the instant invention, a memory device is provided for implementing a zero-enabled fuse system. The memory device of the present invention includes a first set of redundant memory portion to provide redundancy for a first portion of the memory device, and a second set of redundant memory portion to provide redundancy for a second portion of the memory device. The memory device also includes a first set of fuses for activating the first set of redundant memory portion, and a second set of fuses for activating the second set of redundant memory portion. The memory device also includes a controller to control an operation of the first and second set of fuses. The controller is adapted to determine whether a zero address memory location relating to the first memory portion is to be activated based upon an enable fuse. The controller is also adapted to perform a check to determine whether the second set of fuses has been previously activated.

In another aspect of the instant invention, a memory device is provided for implementing a zero-enabled fuse system. The memory device of the present invention includes a first set of fuses for activating a first memory portion, and a second set of fuses for activating a second memory portion. The memory device also includes a controller to control an operation of the first and second set of fuses. The controller is adapted to determine whether a zero address memory location relating to the first memory portion is to be activated based upon an enable fuse. The controller is adapted to also perform a check to determine whether the second set of fuses has been previously activated.

In yet another aspect of the instant invention, a system board is provided for implementing a zero-enabled fuse system. The system board of the present invention includes a first device comprising a memory device for storing data. The memory device includes a first set of redundant memory portion to provide redundancy to a first portion of the memory device, and a second set of redundant memory portion to provide redundancy to a second portion of the memory device. The memory device also includes a first set of fuses for activating the first set of redundant memory portion, and a second set of fuses for activating the second set of redundant memory portion. The memory device also includes a controller to control an operation of the first and second set of fuses. The controller is adapted to determine whether a zero address memory location relating to the first memory portion is to be activated based upon an enable fuse. The controller is adapted to also perform a check to determine whether the second set of fuses has been previously activated. The system board also includes a second device operatively coupled to the first device, the second device to access data from the first device based upon an operation performed by the memory device.

In another aspect of the instant invention, a method is provided for implementing a zero-enabled fuse system. A first set of redundant memory portion in a memory device is associated with a first portion of the memory device. A second set of redundant memory portion in the memory device is associated with a second portion of the memory device. A first set of fuses is associated with the first set of redundant memory portion. The first set of fuses is adapted to activate the first set of redundant memory portion. A second set of fuses is associated with the second set of redundant memory portion. The second set of fuses is adapted to activate the second set of redundant memory portion. An operation of the first and second set of fuses is controlled. Controlling the operation includes determining whether a zero address memory location relating to the first memory portion is to be activated based upon an enable fuse. Controlling the operation also includes performing a check to determine whether said second set of fuses has been previously activated.

BRIEF DESCRIPTION OF THE DRAWINGS

The invention may be understood by reference to the following description taken in conjunction with the accompanying drawings, in which like reference numerals identify like elements, and in which.

Figure 1:
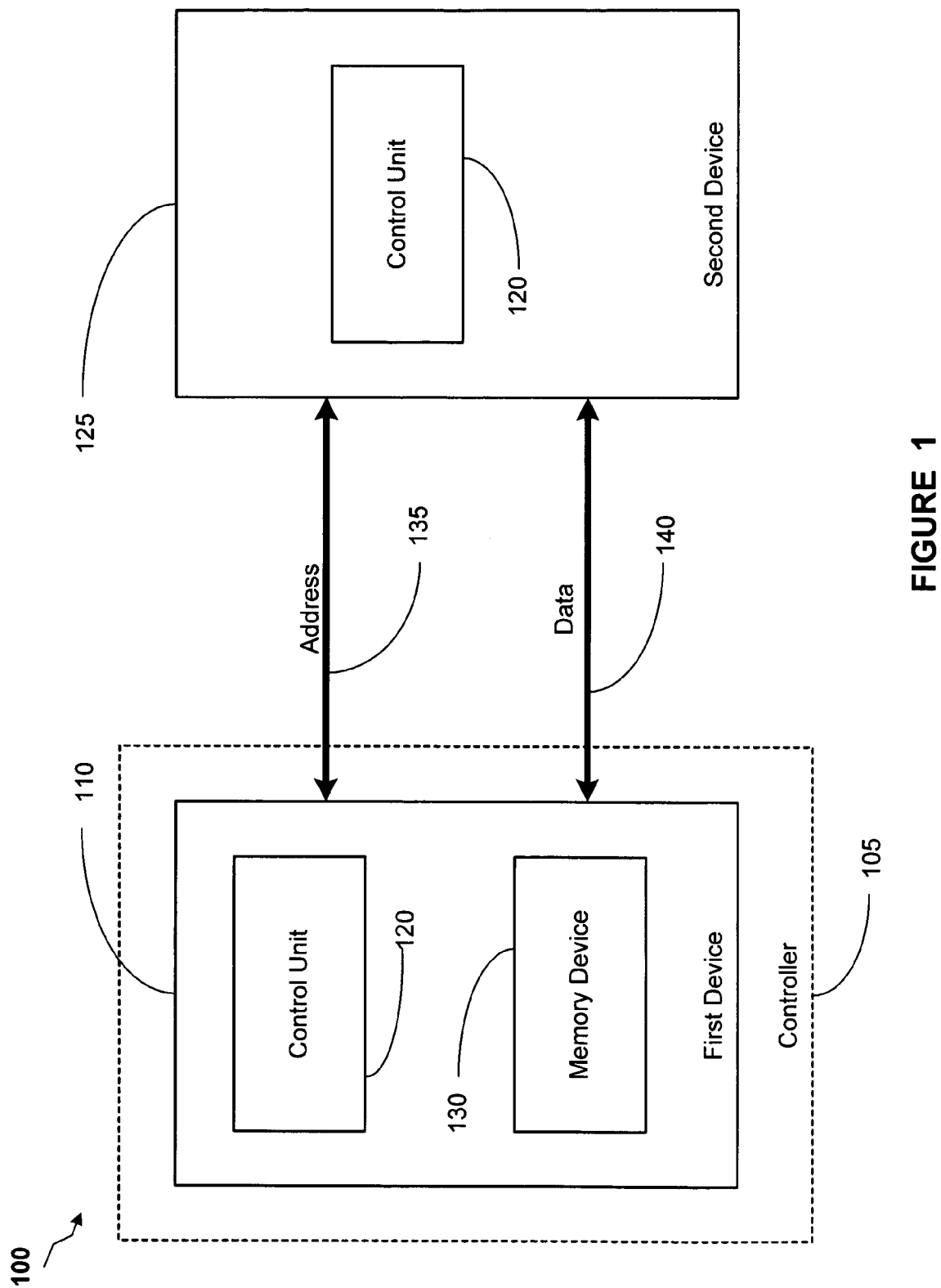
FIG. 1 is a block diagram of a system including a device that is capable of accessing digital signals, in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Embodiments of the present invention provide for implementing redundancy circuits in a device, such as a memory device, while utilizing a substantially smaller number of fuses to enable the redundancy circuits. Embodiments of the present invention provide for a zero-enabled fuse-set implementation to reduce the need for the substantial majority of enable fuses used in a redundancy scheme. State-of-the-art implementation calls for using an enable fuse for each redundancy memory element in a device to indicate whether a specific fuse-set is in use. The enable fuses are used to verify that a fuse-set has been used so that subsequent repair algorithms that invoke redundant circuits do not attempt to use that particular fuse. Additionally, enable fuses may also be used to indicate that an address number zero repair is needed rather than merely indicating that they represent an unused fuse-set. The zero-enabled fuse-set provided by embodiments of the present invention provides for substantial elimination of enable fuses while implementing the verification and indication functions that may indicate that an address-zero repair is indeed a repaired row. This may be performed by utilizing and/or modifying existing global logic already implemented in various existing memory devices. The zero-enabled fuse, in one embodiment, is blown if the address to be repaired is address zero.

Typical redundant systems implement redundancies based upon the number of memory addresses that are going to a particular address decode path, where a fuse is associated with each of the address decode paths. For example, address zero through address ten for each redundancy fuse would independently be able to be decoded and accessed using binary techniques to point to a particular redundant column. So, if column ten was found to be defective, the fuse associated with the binary ten redundant column would be blown to provide an address match at every access path to that particular column. So, at column ten, there would be a match, prompting the device not to use the corresponding primary column thereafter. In other words, the primary column would have then been replaced by the newly implemented redundancy column by blowing the particular fuse. However, a circuit associated with column zero may indicate that no particular fuse has been blown. Therefore, embodiments of the present invention may be used to eliminate virtually all enable fuses associated with fuse banks used for redundancy systems, while using one enable fuse for column address zero.

Referring to FIG. 1, a block diagram of a system 100 is illustrated, in accordance with one embodiment of the present invention. The system 100 comprises a first device 110, which, in one embodiment, may comprise a memory device 130 capable of storing data. In one embodiment, the memory device 130 may be a dynamic random access memory (DRAM), a static random access memory (SRAM), a double-data rate synchronous DRAM (DDR SDRAM, DDR I, DDR II, DDR III), a Rambus™ DRAM (RDRAM), a FLASH memory unit, or the like. The first device 110 may be encompassed by a controller 105. In one embodiment, the controller 105 may be a memory controller, a computer system, such as a PC-computer, and the like. In one embodiment, the controller 105 may be a system board, such as a motherboard for a computer system. The first device 110 may be accessed by a second device 125, which, in one embodiment, may be an accessing/access device. The second device 125 may send addresses on a line 135 to the first device 110. The first device 110 may then provide data to the second device 125 on a line 140. The first and second devices 110, 125 may comprise a control unit 120 capable of accessing data (including code) stored in the memory device 130 of the first device 110. The second device 125 may be any device that uses the first device 110 to store data, read data, or both. Examples of the second device 125 may include, but are not limited to, a computer, a camera, a telephone, a television, a radio, a calculator, a personal digital assistant, a network switch, and the like.

The control unit 120, in one embodiment, may manage the overall operations of the second device 125, including writing and reading data to and from the first device 110. The control unit 120 may comprise a microprocessor, a microcontroller, a digital signal processor, a processor card (including one or more microprocessors or controllers), a memory controller, or other control or computing devices.

In one embodiment, the first device 110 may be a memory chip device, such as a DRAM device, a SRAM device, a FLASH memory device, and the like. In one embodiment, the first device 110 may be a memory chip device that may be implemented into a digital system, such as a computer system. In an alternative embodiment, the first device 110 may be an external memory, such as a memory stick, and may be accessed when inserted into a slot (not shown) of the second device 125. When inserted into the slot, the second device 125 may provide the appropriate power and control signals to access memory locations in the first device 110. The first device 110 may be external to, or internal (e.g., integrated) to, the second device 125. The second device 125, which may be a computer system, may employ a first device 110 (in the form of a memory unit) that is integrated within the computer system to store data (e.g., BIOS [basic input/output system]) related to the computer system.

Figure 2:
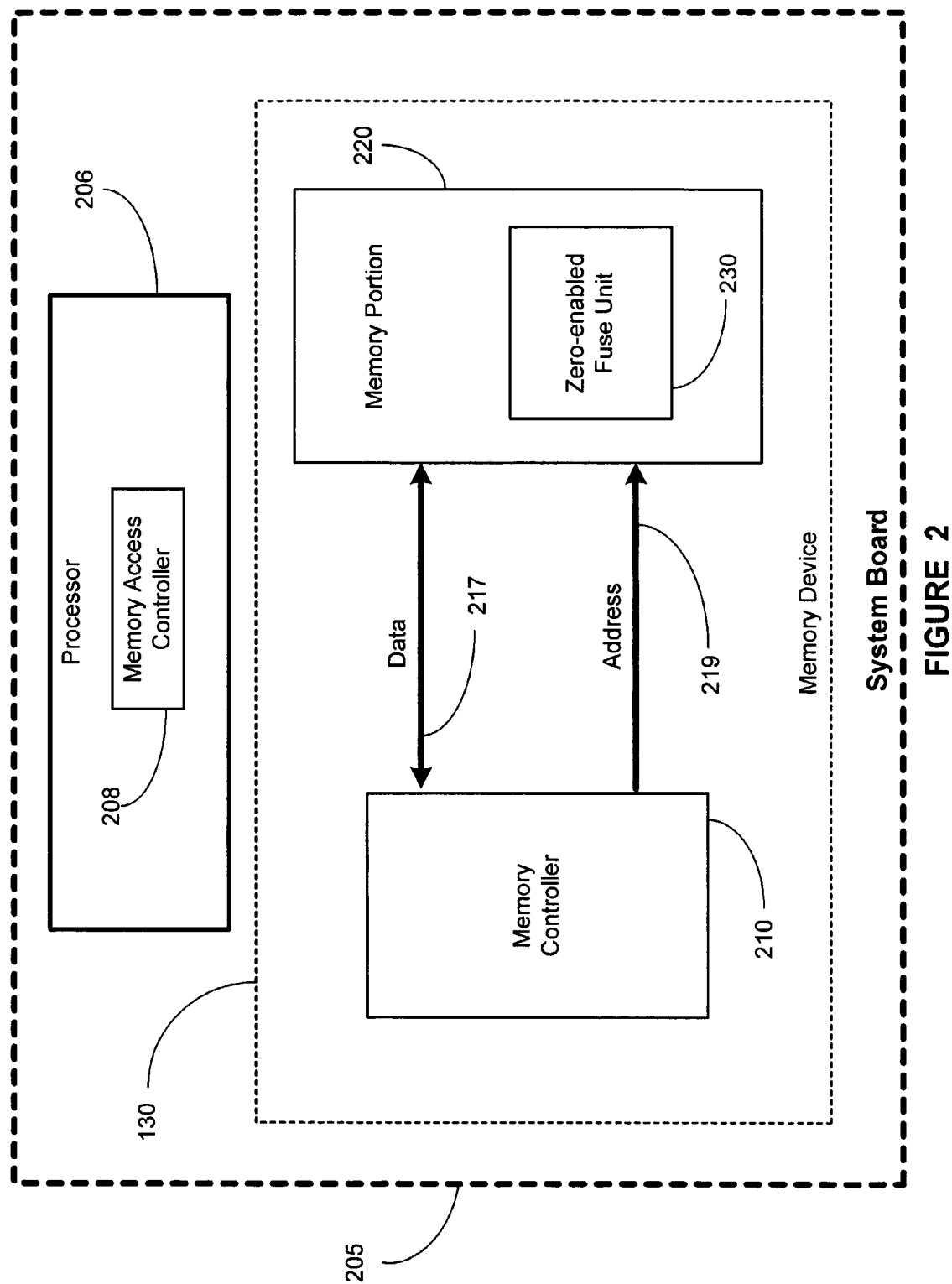
FIG. 2 is a more detailed block diagram representation of the memory device of FIG. 1, in accordance with one illustrative embodiment of the present invention.

Turning now to FIG. 2, a more detailed block diagram depiction of the memory device 130 in accordance with one illustrative embodiment of the present invention is provided. In one embodiment, the memory device 130 comprises a memory controller 210, which is operatively coupled to one or more memory portions 220. The memory controller 210 may comprise circuitry that provides access (e.g., such as storing and extracting data to and from the memory portions 220) to control operations of the memory device 130. The memory portion 220 may be an array of memory storing modules that are capable of storing data.

In one embodiment, the memory controller 210 is capable of sending and/or receiving data from the memory portion 220 via a line 217. The memory controller 210 may send a memory address on a line 219 to the memory portion 220, thereby accessing or sending data to and from memory portion 220. The memory controller 210 may use the address and data lines 217, 219 to supply data to outside sources, such as the second device 125 and/or various components associated with the first device 110 (see FIG. 1).

As shown in FIG. 2, the memory device 130 may be part of a system board 205 (e.g., a printed circuit board) that includes a processor 206. The system board 205 may be a motherboard that is utilized in a variety of types of computer systems, such as an IBM compatible computer system, a workstation computer system, a mainframe computer system, an Apple computer system, a portable computer, a PDA, and the like. The memory controller 210 is capable of receiving and executing memory access functions in response to instructions from the processor 206. The processor 206 may comprise a memory access controller 208 that is used by the processor 206 to access data in the memory device 130.

The memory device 130 may also provide a zero-enabled fuse unit 230. Although one embodiment of the present invention illustrates that the zero-enabled fuse unit 230 is positioned in the memory portion 220, those skilled in the art would appreciate that the zero-enabled fuse unit 230 may reside in various portions of the memory device 130. The zero-enabled fuse unit 230 represents various circuitries that provide for implementation of redundant memory elements within the memory portion 220. The zero-enabled fuse unit 230 may comprise various circuit and logic that may comprise hardware components, software components, firmware components, and/or a combination of components thereof. The zero-enabled fuse unit 230 includes circuitry that is capable of verifying that a fuse-set has been used so that subsequent repair algorithms do not attempt to utilize that particular element which corresponds to that particular fuse. Additionally, the zero-enabled fuse unit 230 may also provide for an indication that address number zero is indeed a repaired row rather than an unused fuse-set. A more detailed description and illustration of the zero-enabled fuse unit 230 is provided in various figures and accompanying description below.

Figure 3:
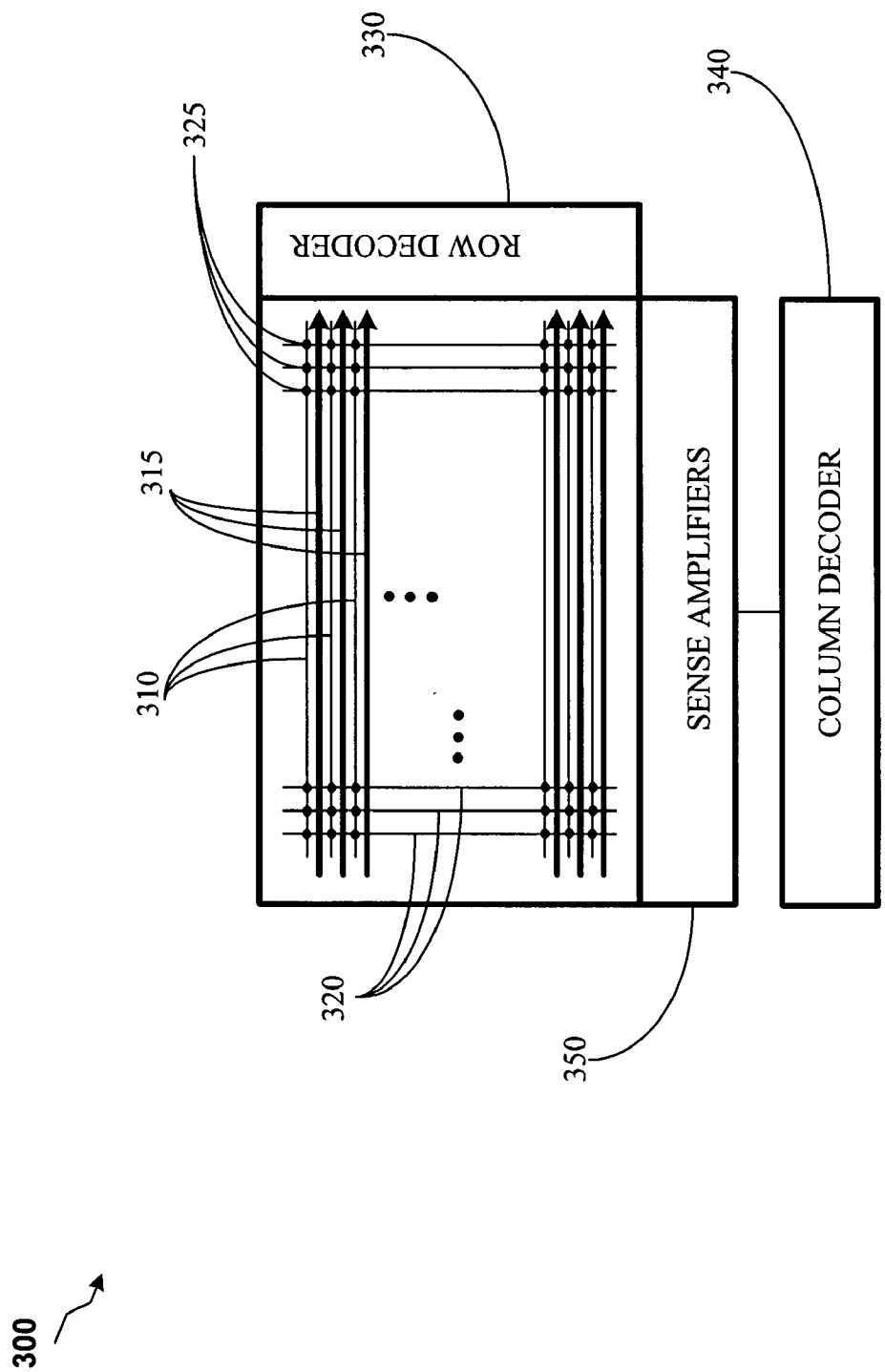
FIG. 3 illustrates a simplified depiction of a semiconductor memory array in a memory portion of FIG. 2, in accordance with one illustrative embodiment of the present invention.

Turning now to FIG. 3, an exemplary arrangement of a semiconductor memory array 300 in the memory portion 220, which may include one or more semiconductor memory arrays 300, is illustrated. The semiconductor memory array 300 includes a plurality of memory cells 325. For example, the semiconductor memory array 300 may include, in one embodiment, 256K ($2^{18}$) memory cells 325. The memory cells 325 may be coupled to a plurality of rows 310 and columns 320. For example, the semiconductor memory array 300 may include 512 ($2^9$) rows 310 and 512 columns 320. Each column 320 may be coupled to 512 memory cells 325, i.e., there is one memory cell 325 for each of the 512 rows 310.

A row decoder 330 may receive row address signals, which may activate selected row(s) 310 in the semiconductor memory array 300. A column decoder 340 may receive column address signals and, based on those signals, may select a particular column 320 in the semiconductor memory array 300. In one embodiment, the column decoder 340 may operatively couple a particular column 320 to one or more sense amplifiers 350. The selection of the row 310 and the column 320 will result in the sensing of the logical state of the memory cell 325 located at the intersection of that row 310 and column 320. The signal representing the logical state of that memory cell 325 may then be coupled to a selected input/output line 315. The input/output lines 315 may, in one embodiment, traverse the semiconductor memory array 300 in a direction parallel to the rows 310 and perpendicular to the columns 320. The input/output lines 315 may exit the semiconductor memory array 300 via the row decoder 330. The processor 206 may access portions of the memory portion 220 via the input/output lines 315.

The components of the semiconductor memory array 300, such as the rows 310, columns 320, and memory cells 325, are generally electrically isolated from each other. Although not so limited, in one embodiment, the components may be electrically isolated from each other by forming shallow trench isolations (STI) in various regions of the substrate. It may, however, be difficult to completely isolate the devices (e.g. the memory cells 325) and/or lines 310, 320, 315. For example, defects in the semiconductor substrate or in the manufacturing process may form an undesirable conducting path between the devices and/or lines 310, 320, 315 in the semiconductor memory array 300 that may cause the semiconductor memory array 300 to malfunction. Other errors may exist in portions of the rows 310 and/or columns 320. Embodiments of the present invention provide for implementing zero-enabled fuses to provide for a redundancy system for providing redundant memory locations for a plurality of the memory elements illustrated in FIG. 3. For various memory locations defined by the rows and columns illustrated in FIG. 3, a redundant memory location may exist in order to access such redundant elements. For example, during a repair process, a circuit provided by the zero-enabled fuse unit 230 may be used to access a corresponding redundant memory element to replace a particular location defined by the row and column. Therefore, a redundant memory row and column may be invoked by accessing particular circuitries associated with the zero-enabled fuse unit 230.

Figure 4:
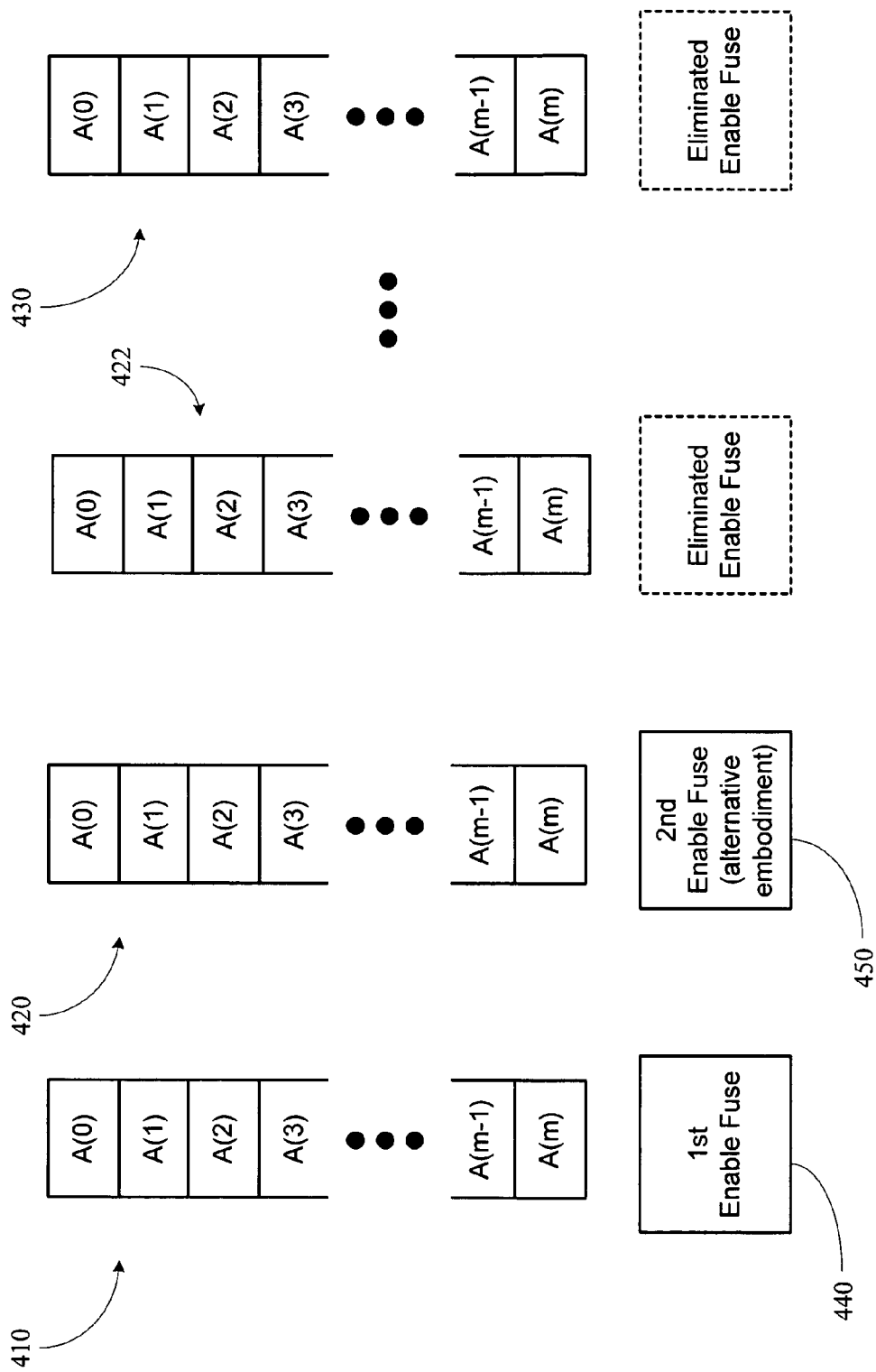
FIG. 4 illustrates a block diagram depiction of a series of fuse banks, in accordance with illustrative embodiments of the present invention.

Turning now to FIG. 4, the block diagram illustration of a multiple fuse-set depiction is provided. FIG. 4 illustrates a first fuse-set 410, a second fuse-set 420, a third fuse-set 422 through an $N^{th}$ fuse-set 430. The fuse-sets 410–430 illustrated in FIG. 4 relate to the fuses for the redundancy memory for the memory portion 220. As illustrated in FIG. 4, each fuse-set may comprise a plurality of address fuses (i.e, A(0), A(2), . . . A(m-1), and A(m)). The first fuse-set 410 has a corresponding first enable fuse 440. In one embodiment, the first fuse-set 410 is a zero-enabled fuse that will be blown if the addresses to be repaired correspond to a redundant memory portion associated with the first fuse-set 410. In that embodiment, the second through $N^{th}$ fuse-sets 420–430 are standard fuse-sets. Therefore, in one embodiment, the first fuse-set 410 is associated with an address for column number zero. In one embodiment, only the first fuse-set comprises a corresponding enable fuse (i.e., the first enable fuse 440). In an alternative embodiment, the first and second fuse-sets 410, 420 both respectively comprise a first and second enable fuse 440, 450. However, utilizing embodiments of the present invention, the additional enable fuses for the fuse-sets (i.e., the third through $N^{th}$ fuse-sets 422–430) are not necessary, as denoted by the dotted blocks shown in FIG. 4.

The first enable fuse 440 provides for asserting an enable bit for enabling the first fuse-set 410. Therefore, the first enable fuse 440 will be blown only if the address to be repaired is address number zero. Additional circuitry (that is described in subsequent figures and accompanying description below) provide for various comparison circuitry to assert a globally routed signal that will disable standard fuse-sets and force a check of the first enable fuse 440 in the zero-enabled fuse-sets 410–430. This would disable the standard fuse-sets and force a check of the first enable fuse 440 in the zero-enabled fuse-set (i.e., the first fuse-set 410). Therefore, standard fuses (i.e., the second through $N^{th}$ fuse-sets 420–430) would not need enable fuses because the global zero-enabled signal generated by the circuitry described above, which is provided in more detail below, will generally shut down matches of unused fuse addresses, which would otherwise produce false positives. More specifically, the enable fuses for various fuse-sets 420–430 are not logically necessary to denote that they are associated with redundant elements that are intended to repair primary addresses.

By virtue of having blown one or more address fuses (i.e., A(0)–A(m)) within a fuse-set 410–430, the zero-enabled fuse unit 230, which comprises various circuitry, may be used to generate the enable signal, as opposed to using a separate enable fuse to generate the enable signal for a particular fuse-set 410–430. However, the exception is that the address combination of zero address decodes to no fuses blown instance. Therefore, as illustrated in FIG. 4, various fuses may be deleted for several fuse-set banks, such as the second through $N^{th}$ fuse-set bank 420–430.

The first fuse-set 410 comprises zero-enabled fuse that will be blown if the memory element corresponding to an address to be replaced is address zero. In an alternative embodiment, a second enable fuse 450 may be added to correspond with the second fuse-set bank 420. The second enable fuse 450 may be added in conjunction with the second fuse-set 420 to provide for possible increased yield of semiconductor devices.

The circuitry provided by the zero-enabled fuse unit 230 may also provide for the use of the enable fuses 440, 450 to signify that the bank of fuses corresponding to the first fuse-set 410 is used or is available. In order to maintain this functionality while implementing an enable-less fuse-set, a test is performed to determine if any fuses in a particular fuse-set has been blown. If a fuse in a fuse-set has been blown, it would be an indication that this particular fuse-set is being used for possible redundancy implementation of memory to replace a defective primary memory set. If a fuse is not blown, then it may be an indication that this particular fuse-set is available since the enable-less fuse-set generally cannot be used to hold an address of all zeros. To implement this test, a step of forcing all zeros into the address bus may be performed. Subsequently, this address is compared to the fuses in each fuse-set if they match. If there is a match, then there is an implication that no fuses in that particular fuse-set is blown. Therefore, if a signal that indicates that a fuse is blown becomes active, it may be interpreted that the particular fuse-set associated with that blown fuse is indeed available. If the comparison function does not produce a match, then a determination may be made that at least one fuse in this fuse-set 420–430 is blown since it does not match a zero. Therefore, the signal indicating that the set is un-blown becomes inactive. Utilizing the zero-enabled fuse 230 provided by embodiments of the present invention for the first fuse-set 410, an N-1 savings in enable fuses may be realized. In the alternative embodiment described above, an N-2 savings end fuses may be realized, where a second enable fuse 450 is used. This provides for smaller device footprint as well as savings in power consumption in various semiconductor devices.

The present invention may be implemented such that if a fuse corresponding to the addresses relating to a particular memory element is going to be blown, then a determination may be made whether any one of those fuses associated with that redundant memory element is blown. Once indication exists that such a fuse is blown, then it may be determined that there was an intention to bring that element in an active mode as a redundant element to replace a defective primary memory element. Therefore, an enable fuse may not be necessary. However, for the case of column address zero, the first enable fuse 440 is provided for allowing enabling of the fuse-set 410 to be used for column zero. Therefore, the first enable fuse 440 has to be actively engaged to use column zero for redundancy implementation. Hence, the vast majority of enable fuses for each of the fuse-sets 420–430 may be eliminated.

Figure 5:
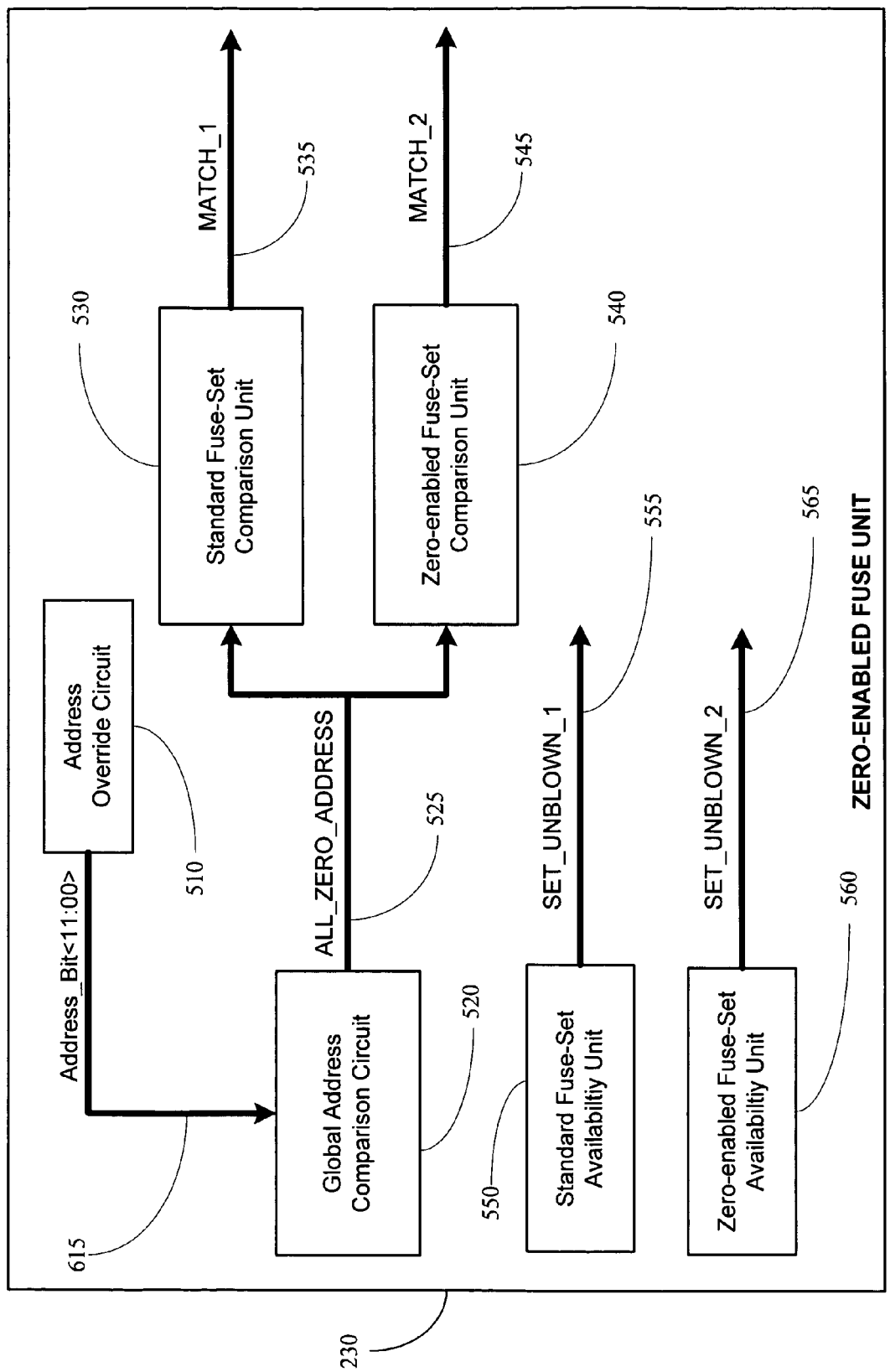
FIG. 5 illustrates a block diagram representation of a zero-enabled fuse unit of FIG. 2, in accordance with one illustrative embodiment of the present invention.

In order to provide for the elimination of various enable fuses and the implementation of zero-enabled fuses, embodiments of the present invention provide for various circuit control implementation provided by the zero-enabled fuse unit 230. Turning now to FIG. 5, a block diagram depiction of various components of the control circuit associated with implementing the zero-enabled fuses provided herein is illustrated. In one embodiment, the zero-enabled fuse unit 230 may comprise an address override circuit 510 that provides a zero-address bus to a global address comparison circuit 520. In one embodiment, the global address comparison circuit 520 is capable of causing a disabling of all non-zero enabled fuse-sets (e.g., second through N$^{th}$ fuse-sets 420–430) using a global signal that triggers when the address to be compared is an all-zero address.

Figure 6:
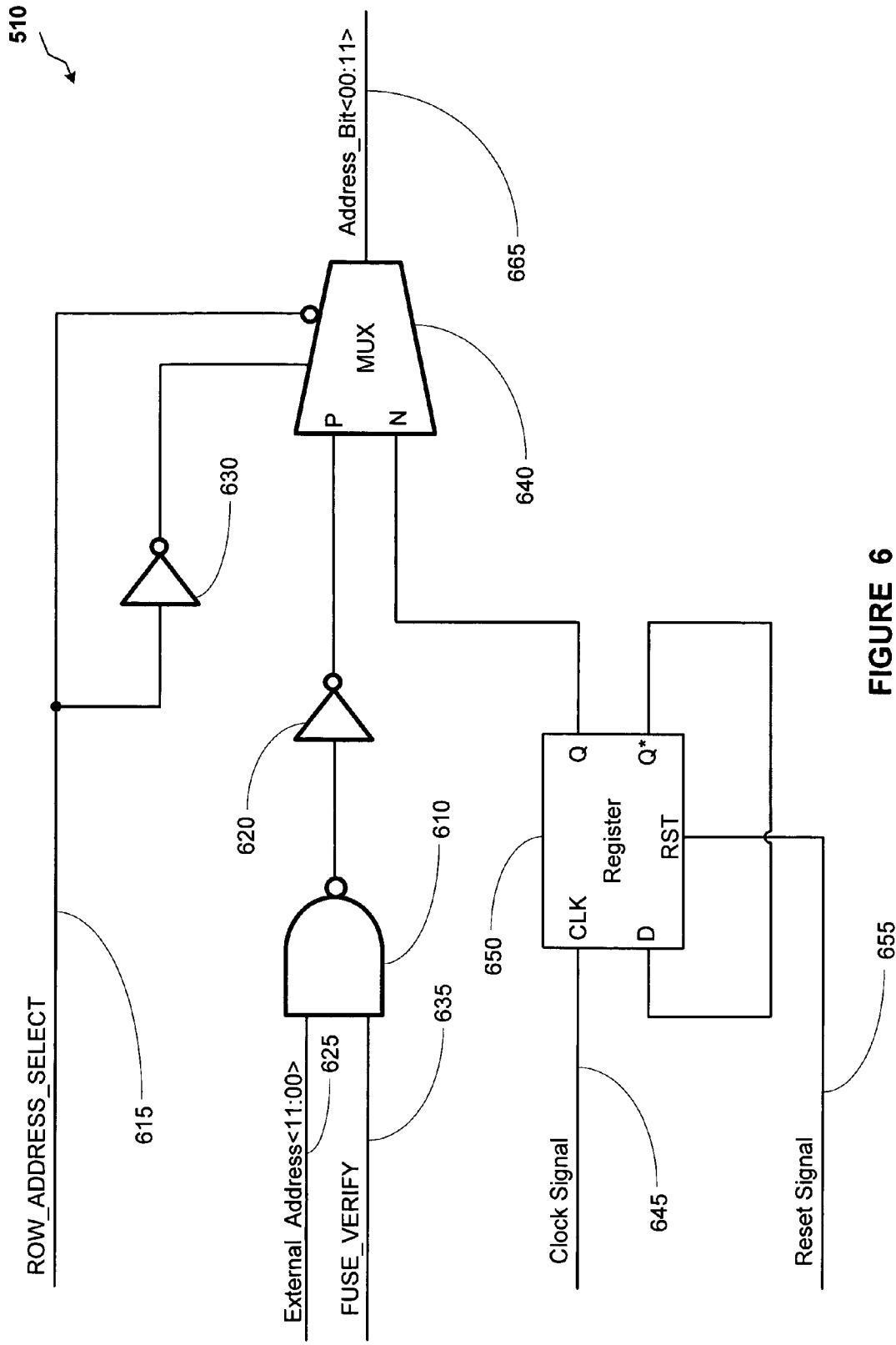
FIG. 6 illustrates a circuit diagram of a row address override circuit of FIG. 5, in accordance with one illustrative embodiment of the present invention.

Referring simultaneously to FIGS. 5 and 6, one implementation of the address override circuit 510 in accordance with embodiments of the present invention, is illustrated. The address override circuit 510 comprises a NAND gate 610 that receives an external address, which in one embodiment, may be a 12-bit address bus on a line 625 (labeled External_Address<11:00>). The line 625 may represent a plurality of lines used on a bus, External_Address<11:00>. The NAND gate 610 also receives the FUSE_VERIFY signal on a line 635 that is asserted to invoke a command to verify whether a particular fuse is blown. The output from the NAND gate 610 is inverted by an inverter 620 and sent to a multiplexer 640.

The control for the multiplexer 640 is controlled by a ROW_ADDRESS_SELECT signal on a line 615, which provides the positive and the negative version of the ROW_ADDRESS_SELECT signal directly, and through an inverter 630, to the multiplexer 640. The positive and negative version of the ROW_ADDRESS_SELECT signal respectively activate either the positive input or the negative input of the multiplexer 640 as the output of the multiplexer 640. The NAND gate 610 and the inverter 620 work together to provide a row address override in order to "zero out" the address fed into the global address comparison circuit 520. This is performed in order to enable the verify scheme implemented by the zero-enabled fuse implementation provided by embodiments of the present invention. Although various embodiments of the present invention are described in terms of row addresses, concepts of the present invention may also be applied in the context of column addresses.

The negative input into the multiplexer 640 is an output of a register 650 that is clocked by the clock signal on the line 645 and controlled by a reset signal on the line 655. The Q output of the register 650 is sent to the negative input of the multiplexer 640, while the Q* output of the register 650 is fed-back into the D-input of the register 650. The output of the multiplexer 640 is an ADDRESS_BIT<00:11> signal on a line 665. State-of-the-art calls for the enable fuses being sampled in order to verify whether a fuse-set has already been used. This step may not be necessary if the global address comparison circuit 520 is used to compare the contents with an ALL_ZERO_ADDRESS and a zero-enabled feature is disabled. The non-zero enabled fuse-sets will be disabled during a global signal that triggers when the address to be compared is an ALL_ZERO_ADDRESS, which is provided on the ADDRESS_BIT signal on the line 665 to the global address comparison circuitry 520. The disabling of the non zero-enabled fuse-sets e.g., the second through N$^{th}$ fuse-sets 420–430, may be integrated into existing enable circuitry in various memory devices, thereby resulting in a substantially smaller increase in logic gate counts.

Figure 7:
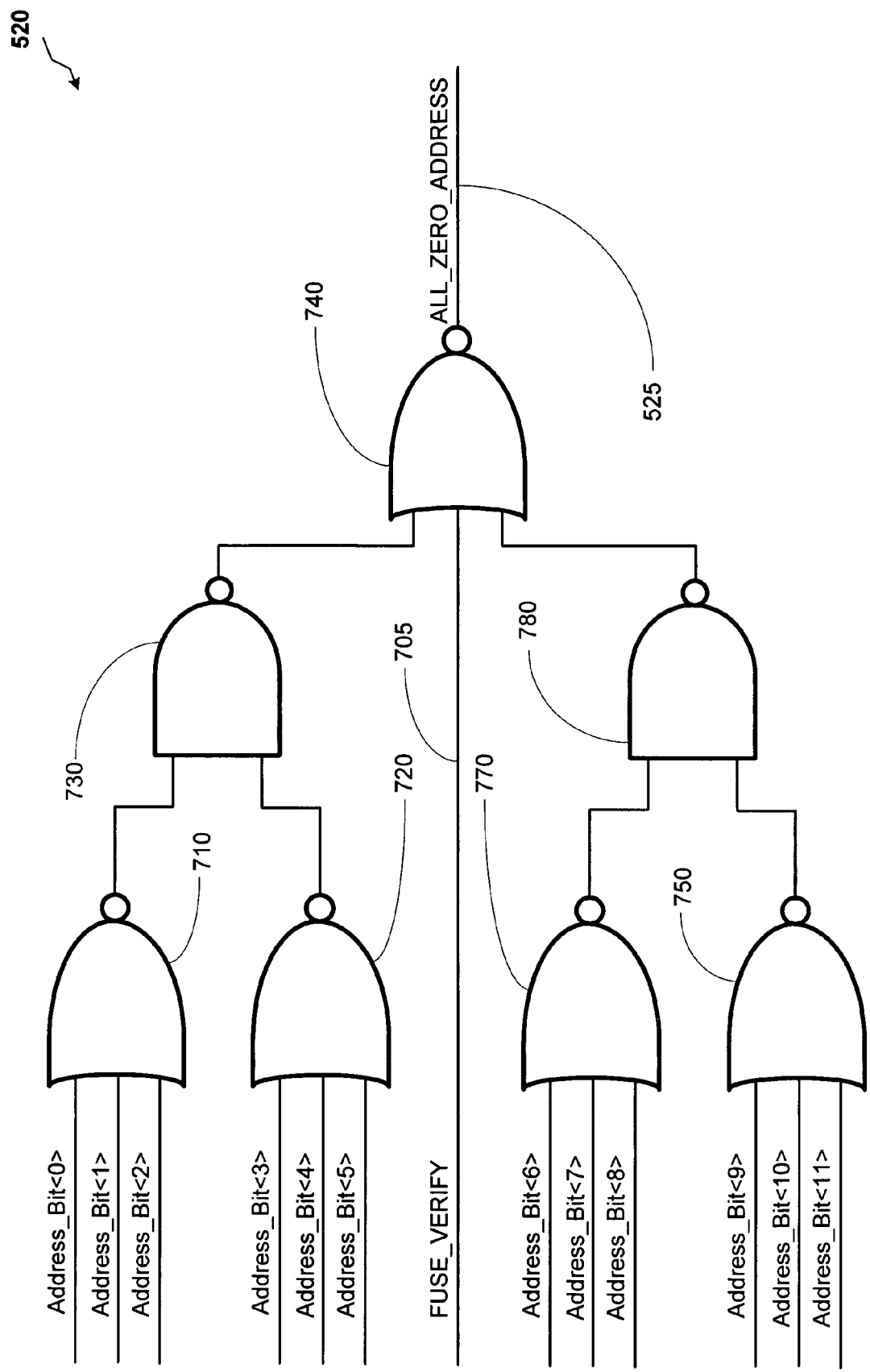
FIG. 7 illustrates a circuit diagram of a global address comparison circuit of FIG. 5, in accordance with one illustrative embodiment of the present invention.

Referring now simultaneously to FIGS. 5 and 7, a block diagram depiction of the global address comparison circuit 520, in accordance with one embodiment of the present invention, is illustrated. The global address comparison circuit 520 comprises a NOR gate 710, which receives the first three bits of the ADDRESS_BIT signal on line 665. Although embodiments of the present invention are described in the terms of a 12-bit ADDRESS_BIT, it would be appreciated by those skilled in the art having benefit of the present disclosure, that any other size of addresses may be used and remain within the spirit and scope of the present invention. A NOR gate 720 receives the fourth through sixth bits of the ADDRESS_BIT signal. The output of the first and second NOR gates 710, 720 are then sent to a NAND gate 730, whose output is provided as a first input to a NOR gate 740. Similarly, a NOR gate 770 receives the sixth, seventh through ninth bits of the ADDRESS_BIT signal, while a NOR gate 750 receives the tenth through twelfth bits of the ADDRESS_BIT signal.

The outputs of the NOR gate 770 and 750 are then sent to the input of a NAND gate 780, whose output is provided as a second input into the NOR gate 740. A third input into the NOR gate 740 is the FUSE_VERIFY signal asserted to initiate a command to verify the activation of a particular fuse. The output of the NOR gate 740 is an ALL_ZERO_ADDRESS signal that signifies whether all bits of the global address in the ADDRESS_BIT bus on the line 665 is zero or not.

As illustrated in FIG. 5, The ALL_ZERO_ADDRESS on the line 525 is sent to a standard fuse-set comparison unit 530 and a zero-enabled fuse-set comparison unit 540 for determining if a match with either a standard fuse-set or a zero-enabled fuse-set exists. The signal FUSE_VERIFY on the line 705 would be able to disable the global compare circuitry, e.g., global address comparison circuit 520, in order to properly operate fuse verifications and redundant pretests. As described above, a zero-enabled fuse-set (e.g., the first fuse-set 410) will have a fuse that will be blown only if the address to be repaired is address zero. If the compare address is zero and the fuse is not blown, then the compare circuitry will be disabled and show no match, as described below.

Figure 8:
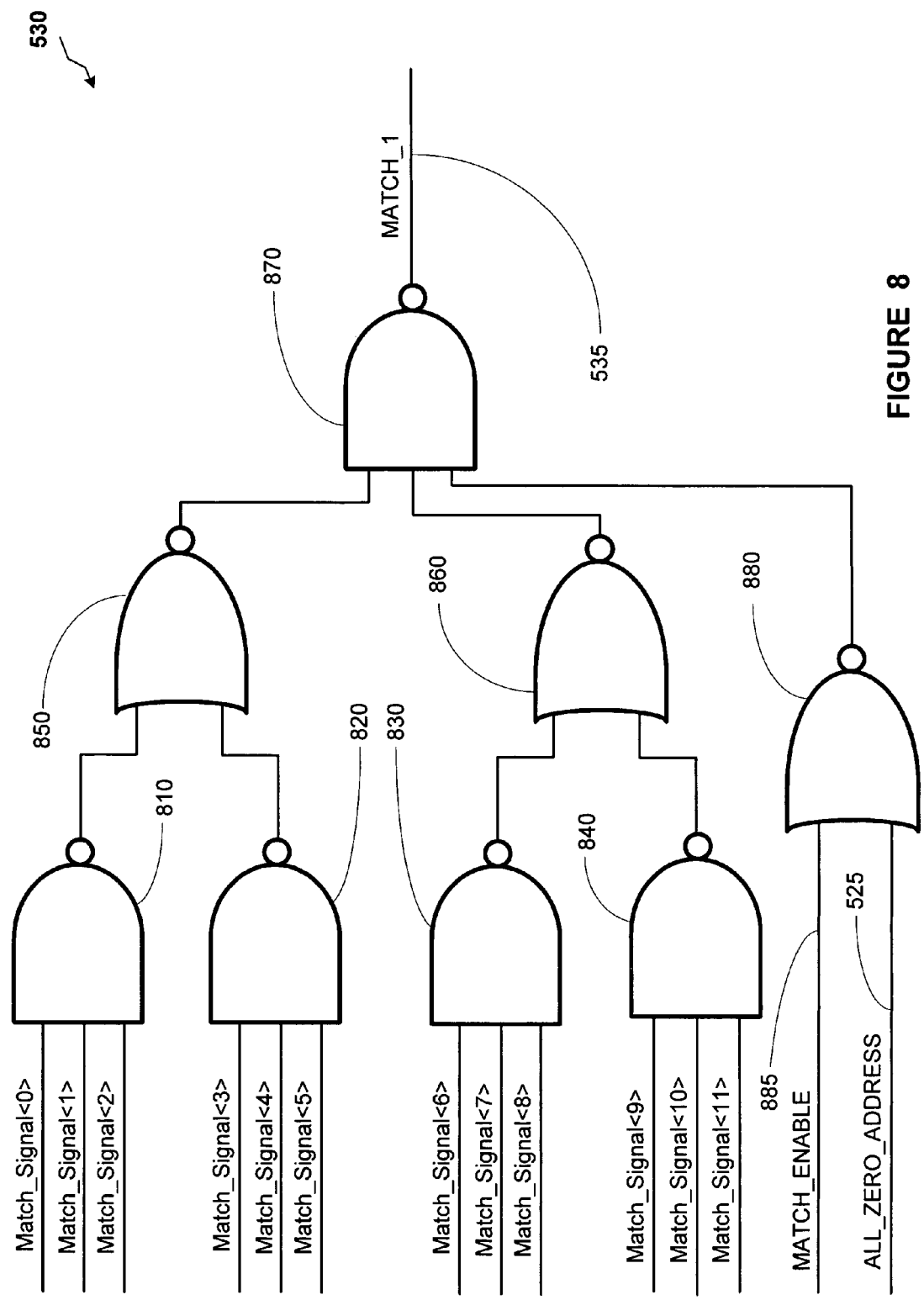
FIG. 8 illustrates a circuit diagram of a standard fuse-set comparison unit of FIG. 5, in accordance with one illustrative embodiment of the present invention.

Referring simultaneously to FIGS. 5 and 8, one implementation of the standard fuse-set comparison unit 530 in accordance with embodiments of the present invention is illustrated. The standard fuse-set comparison unit 530 in FIG. 5 receives a MATCH_SIGNAL bus, which provides for an exemplary 12-bit MATCH_SIGNAL bus. The MATCH_SIGNAL bus corresponds to a particular address location in order to determine whether a particular match has been made with a certain memory location. The first three bits of the MATCH_SIGNAL bus are sent to a first NAND gate 810. The fourth through sixth bits of the MATCH_SIGNAL bus is sent to a second NAND gate 820. The outputs of the first NAND gate 810 and the second of the NAND gate 820 are sent as inputs to a NOR gate 850, whose output is sent to a NAND gate 870, which is capable of asserting a MATCH_1 signal on a line 535. The MATCH_1 signal signifies that a match for a standard fuse-set has been determined.

The seventh through ninth bits of the MATCH_SIGNAL bus are sent to a NAND gate 830. The tenth through twelfth bits of the MATCH_SIGNAL bus are sent to a NAND gate 840. The output of the NAND gates 830 and 840 are then sent to a NOR gate 860, whose output is provided as a second input to the NAND gate 870, which asserts the MATCH_1 signal on the line 535. The ALL_ZERO_ADDRESS indication on the line 525 and a MATCH_ENABLE signal on a line 885, which enables the task of determining whether a match of a standard fuse-set signal should be checked, is provided to a NOR gate 880. The output of the NOR gate, which depends on the assertion of the ALL_ZERO_ADDRESS on the line 525, is sent to the NAND gate 870. Based upon the inputs of the NAND gate 870, the MATCH_1 signal on the line 535 is asserted indicating that a standard fuse-set has been matched for redundancy implementation.

Turning back to FIG. 5, the global address comparison circuit 520 also provides the ALL_ZERO_ADDRESS signal on the line 525 to the zero-enabled fuse-set comparison unit 540 in order to determine whether a zero-enabled fuse-set match has been determined. The MATCH_SIGNAL bus is also sent to the zero-enabled fuse-set comparison unit 540, which asserts a MATCH_2 signal on a line 545 to indicate that a zero-enabled fuse-set has been matched.

Figure 9:
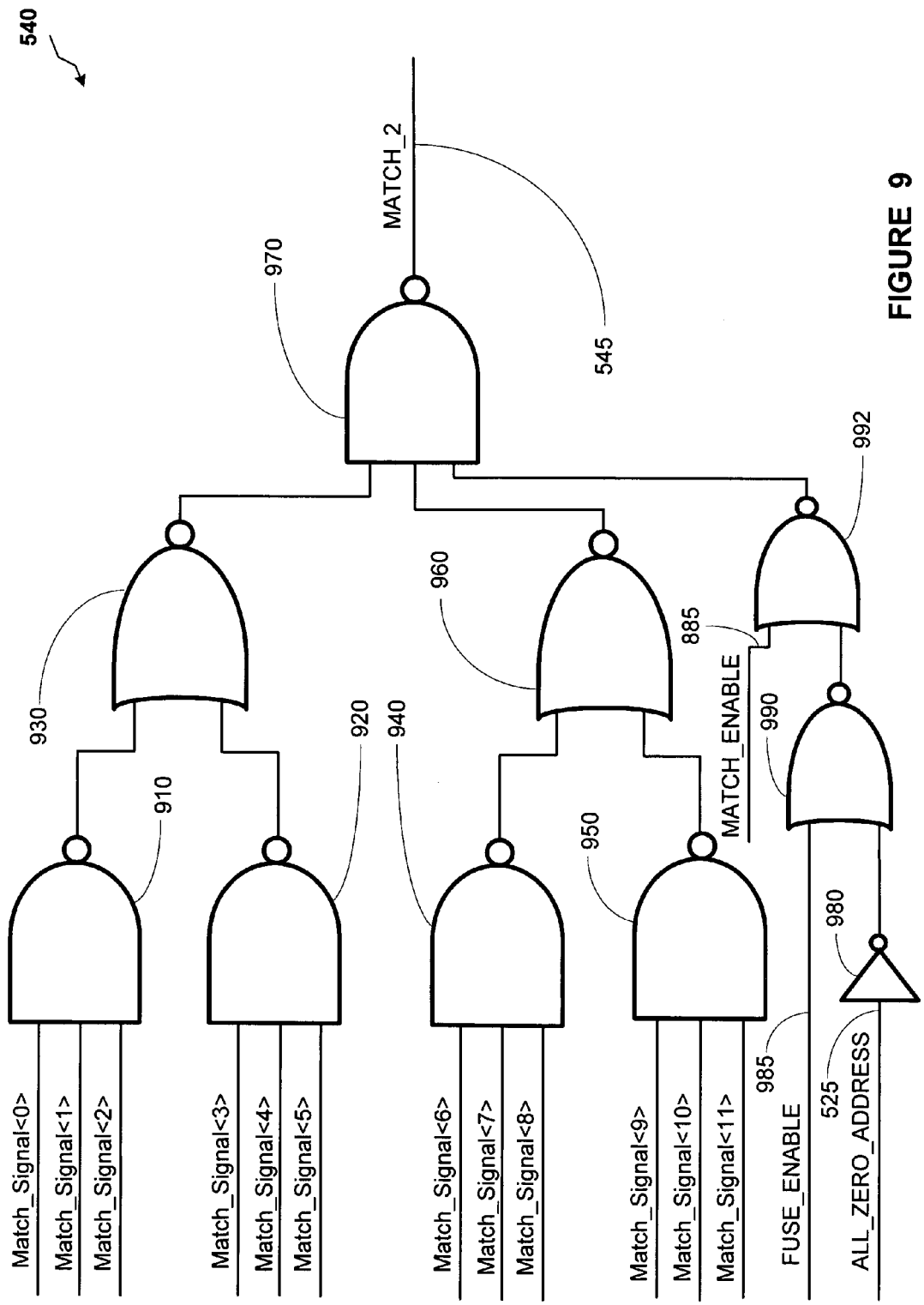
FIG. 9 illustrates a circuit diagram of a zero-enabled fuse-set comparison unit of FIG. 5, in accordance with one illustrative embodiment of the present invention.

Referring simultaneously to FIGS. 5 and 9, the first through third bits of the MATCH_SIGNAL bus are sent to a NAND gate 910. The fourth through sixth bits of the MATCH_SIGNAL bus are sent to a NAND gate 920. The outputs of the NAND gates 910 and 920 are sent to the inputs of a NOR gate 930. The output of the NOR gate 930 is a first input to a NAND gate 970, which asserts or de-asserts a MATCH_2 signal on the line 545, indicating whether a match with a zero-enabled fuse-set has been made. The seventh through tenth bits of the MATCH_SIGNAL bus are sent to the inputs of a NAND gate 940. The tenth through twelfth bits of the MATCH_SIGNAL bus are sent to the inputs of a NAND gate 950. The outputs of the NAND gates 940 and 950 provide the inputs into a NOR gate 960. The output of the NOR gate 960 provides a second input into the NAND gate 970 which produces the MATCH_2 signal on the line 545.

Assertion of the MATCH_2 signals on the line 545 depends on the value of the MATCH_SIGNAL bus, as well as the assertion of the FUSE_ENABLE signal on a line 985, which enables the examination of the zero-enabled fuse-set. Assertion of the MATCH_2 signal also depends upon the MATCH_ENABLE signal on the line 885, as well as upon the assertion of the ALL_ZERO_ADDRESS signal on the line 525. The ALL_ZERO_ADDRESS signal on the line 525 is inverted by an inverter 980, whose output is then sent to a NOR gate 990. The second input into the NOR gate 990 is the FUSE_ENABLE signal on the line 985. The output of the NOR gate 990 provides a first input into a NOR gate 992, whose second input is the MATCH_ENABLE signal on the line 885. The output of the NOR gate 992 provides a third input into the NAND gate 970. Based upon the match signals, the FUSE_ENABLE signal, the MATCH_ENABLE signal, and the ALL_ZERO_ADDRESS signal, the zero-enabled fuse-set comparison unit 540 asserts or de-asserts the MATCH_2 signal on the line 545 to provide an indication whether a zero-enabled fuse-set has been matched or not. Based upon the MATCH_1 signal or the MATCH_2 signal, a determination may be made whether a particular fuse-set, either the standard fuse-set or the zero-enabled fuse-set 410, has been blown or not.

Figure 10:
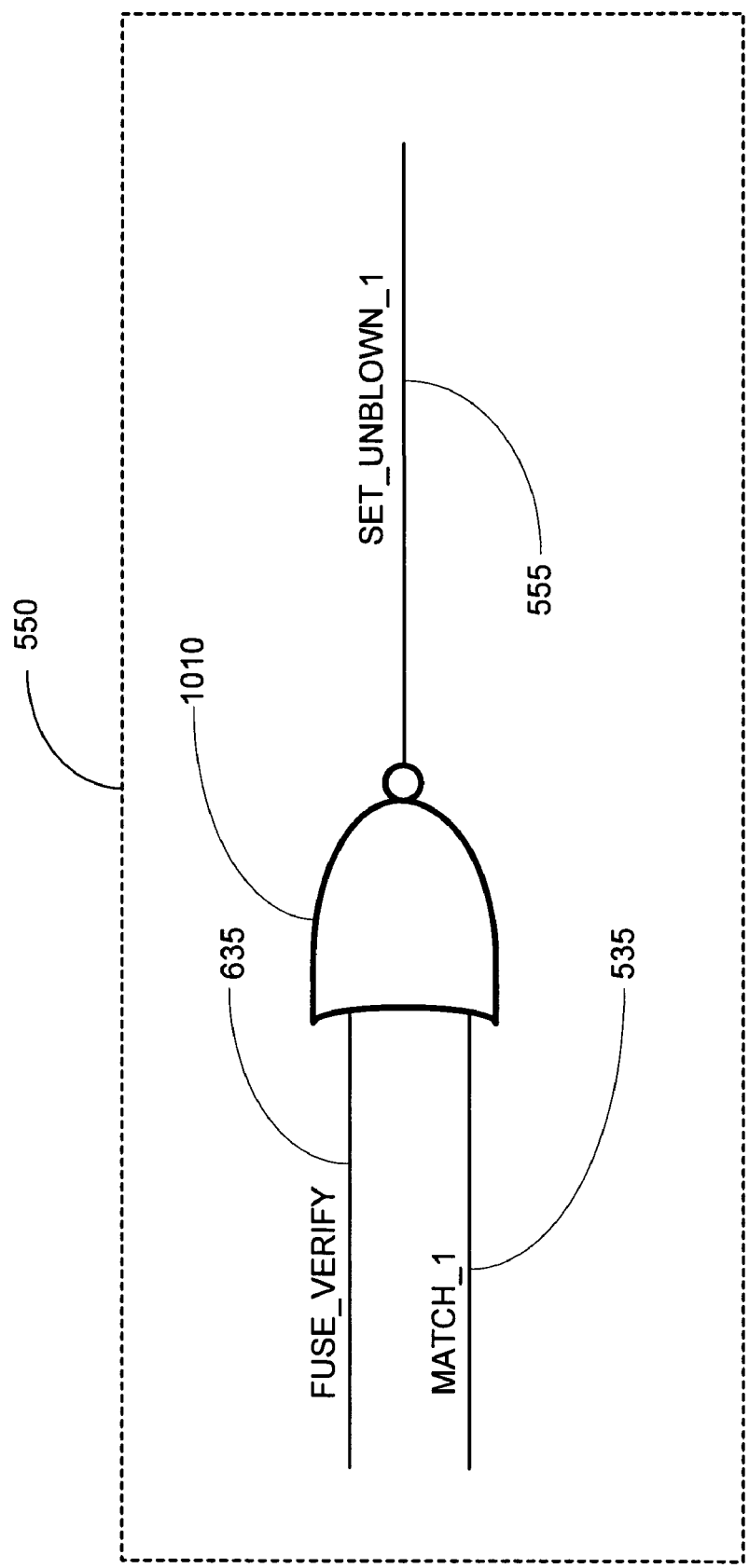
FIG. 10 illustrates a circuit diagram of a standard fuse-set availability unit of FIG. 5, in accordance with one illustrative embodiment of the present invention.

Referring simultaneously to FIGS. 5 and 10, a circuit implementation of the standard fuse-set availability unit 550, in accordance with one embodiment of the present invention, is provided. A standard fuse-set availability unit 550 provides an indication that a standard fuse-set (e.g., fuse-set 422–430) is available or not available by asserting or de-asserting a SET_UNBLOWN_1 signal on a line 555. The FUSE_VERIFY signal on the line 635 described above and the MATCH_1 signal on the line 535 from the standard fuse-set comparison unit 530, provide the first and second inputs into a NOR gate 1010. The output of the NOR gate is the signal SET_UNBLOWN_1 on a line 555, which provides an indication whether the standard fuse-set (e.g., fuse-set 422–430) has been blown or not, thereby providing an indication whether a particular standard fuse-set is available or not. By sampling the MATCH_1 signal on the line 535, the zero enabled fuse unit 230 is capable of verifying whether a standard fuse-set 420–430 has been blown or not, thereby negating the need for an enable bit (enable fuse) for that particular fuse-set. Therefore, a plurality of the enable fuses may be eliminated with the implementation of a redundancy system in a device.

Figure 11:
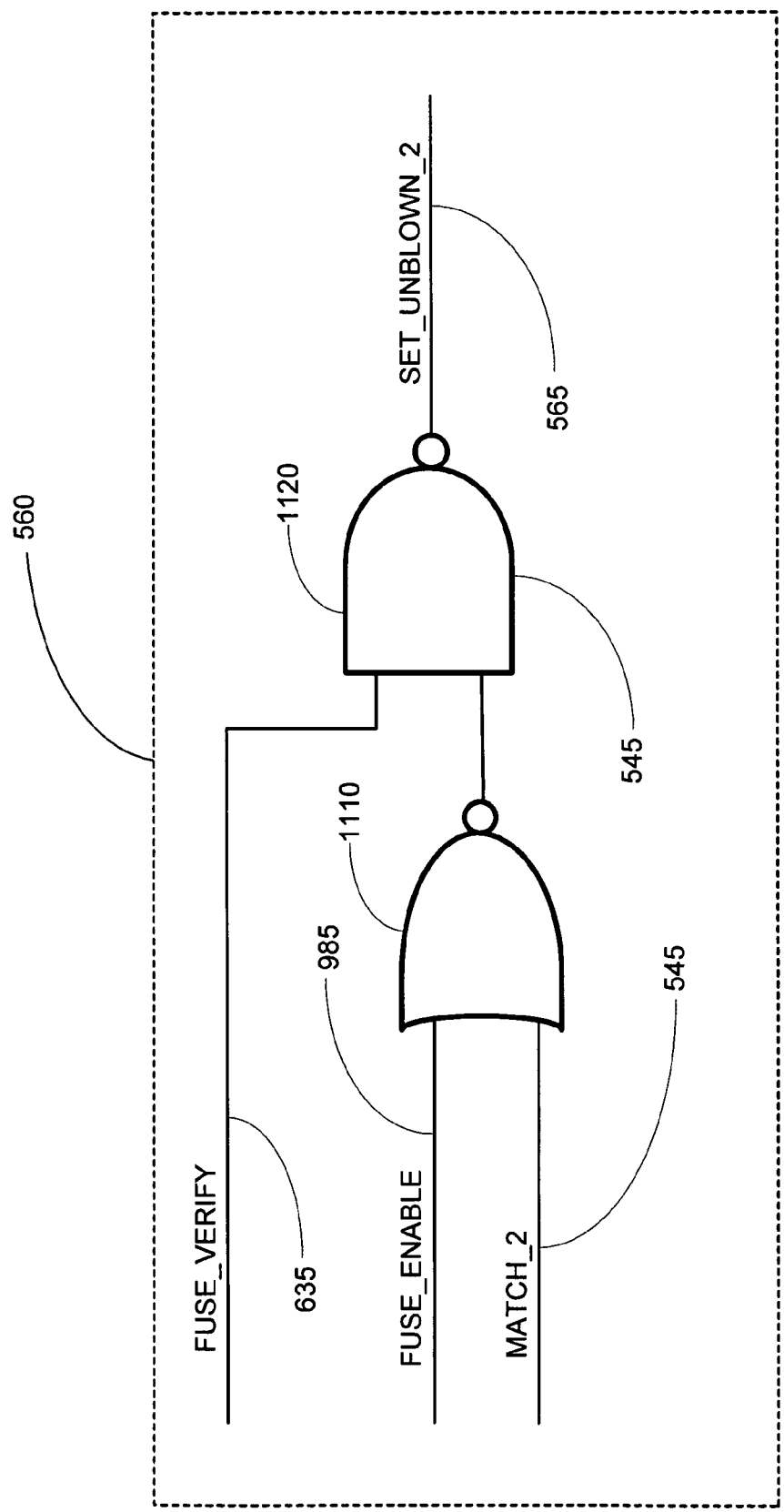
FIG. 11 illustrates a circuit diagram of a zero-enabled fuse-set availability unit of FIG. 5, in accordance with one illustrative embodiment of the present invention.

Referring simultaneously to FIGS. 5 and 11, a circuit implementation of a zero-enabled fuse-set availability unit 560, in accordance with one embodiment of the present invention is illustrated. The FUSE_ENABLE signal on a line 985 and the MATCH_2 signal on a line 545, which indicates a match with a zero-enabled fuse-set 410, are provided as the first and second inputs of a NOR gate 1110. The output of the NOR gate is provided as a first input of a NAND gate 1120. A second input into the NAND gate 1120 is the FUSE_VERIFY signal on the line 635, which is asserted to provide a command to verify the status of a particular fuse-set. The output of the NAND gate 1120 provides an assertion or a de-assertion of the SET_UNBLOWN_2 signal on a line 565. The assertion or de-assertion of the SET_UNBLOWN_2 signal on the line 565 provides an indication whether the zero-enabled fuse-set 410 (e.g., the first fuse-set) has been blown or not, thereby indicating whether the zero-enabled fuse-set is available to implement redundancy memory. Sampling the MATCH_2 signal on the line 545 as well as the FUSE_ENABLE signal on the line 985 in a zero-enabled fuse-set, when verifying fuses, will confirm whether any specific zero-enabled fuse-set has been blown.

Utilizing embodiments of the present invention, a zero-enabled fuse-set implementation may be provided into a device such as a memory device. Implementing the zero-enabled fuse-set scheme provided by embodiments of the present invention, a number of fuses that otherwise would be implemented into the redundancy scheme of a memory unit may now be eliminated. Therefore, a substantial savings in device real estate, as well as power consumption, may be realized, thereby providing for devices that are smaller and of higher performance. Embodiments of the present invention may be implemented into a variety of types of products including microprocessors, digital signal processors (DSP), a variety of memory products and the like. The teachings of the present invention may be implemented on a plurality of types of memory devices, such as flash memory, DRAM memory, and other volatile and/or non-volatile memory devices.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A device, comprising:
    a first set of fuses for activating a first memory portion;
    a second set of fuses for activating a second memory portion; and
    a controller to control an operation relating to said first and second set of fuses, said controller to determine whether a zero address memory location relating to said first memory portion is to be activated based upon an enable fuse, said controller to also perform a check to determine whether said second set of fuses has been previously activated.

2. The device of claim 1, wherein said device is a memory device.

3. The device of claim 2, wherein said memory device is at least one of a static random access memory (SRAM), a dynamic random access memory (DRAM), a double-data rate SDRAM (DDR SDRAM), a DDR I device, a DDR III device, a Rambus DRAM (RDRAM), and a FLASH memory.

4. The device of claim 2, wherein said first set of fuses to provide access to a redundant memory portion of said memory device that corresponds to a first memory location address of zero.

5. The device of claim 4, wherein said second set of fuses to provide access to said redundant memory portion of said memory device that corresponds to a second memory location address.

6. The device of claim 1, wherein said controller to determine whether said zero address memory location associated with said memory portion of said device is defective.

7. The device of claim 1, wherein said first set of fuses comprises a plurality of zero-enabled fuses, said zero-enabled fuses comprising an electrical element that is activated in response to a determination that said memory address location of zero associated with said memory portion of said device is defective.

8. The device of claim 1, wherein said second set of fuses comprises a plurality of standard fuses.

9. The device of claim 1, wherein said device further comprises an enable fuse for performing said check to determine whether said first set of fuses has been previously activated.

10. The device of claim 9, wherein said device being adapted to determine that said first set of fuses is available based upon a determination that said first set of fuses has not been previously activated.

11. The device of claim 1, wherein said device being adapted to determine whether said second set of fuses has been previously activated without using said enable fuse.

12. The device of claim 1, wherein said device further comprises:
    an address override circuit to provide an address bus that is zeroed;
    a global address comparison circuit operatively coupled to said address override circuit, said global address comparison circuit to assert an all-zero-address signal to disable said second fuse-set based upon said address bus being zeroed;
    a standard fuse-set comparison unit operatively coupled to said global address comparison circuit, said standard fuse-set to assert a first match signal in response to a determination that said second set of fuses has not been previously activated based upon said all-zero-address signal;
    a zero-enabled fuse-set comparison unit operatively coupled to said global address comparison circuit, said zero-enabled fuse-set comparison unit to assert a second match signal in response to a determination that said first set of fuses has not been previously activated;
    a standard fuse-set availability unit to determine whether said second set of fuses is available to provide activation of said redundant memory portion based upon said first match signal; and
    a zero-enabled fuse-set availability unit to determine whether said first set of fuses is available to provide activation of said redundant memory portion based upon said second match signal.

13. A memory device, comprising:
    a first redundant memory portion to provide redundancy for a first portion of said memory device;
    a second redundant memory portion to provide redundancy for a second portion of said memory device;
    a first set of fuses for activating said first redundant memory portion;
    a second set of fuses for activating said second redundant memory portion; and
    a controller to control an operation of said first and second set of fuses, said controller to determine whether a zero address memory location relating to said first memory portion is to be activated based upon an enable fuse, said controller to also perform a check to determine whether said second set of fuses has been previously activated.

14. The memory device of claim 13, wherein said memory device is at least one of a static random access memory (SRAM), a dynamic random access memory (DRAM), a double-data rate SDRAM (DDR SDRAM), a DDR I device, a DDR III device, a Rambus DRAM (RDRAM), and a FLASH memory.

15. The memory device of claim 13, wherein said first portion of said memory device corresponds to a memory location address of zero.

16. The memory device of claim 13, wherein said controller to determine whether said zero address memory location associated with a memory portion of said device is defective.

17. The memory device of claim 16, wherein said first set of fuses comprises a plurality of zero-enabled fuses, said zero-enabled fuses comprising an electrical element that is activated in response to a determination that a memory address location of zero associated with said memory portion of said device is defective.

18. The memory device of claim 13, wherein said second set of fuses comprises a plurality of standard fuses.

19. The memory device of claim 13, wherein said device further comprises said enable fuse for performing said check to determine whether said first set of fuses has been previously activated.

20. The memory device of claim 19, wherein said device being adapted to determine that said first set of fuses is available based upon a determination that said first set of fuses has not been previously activated.

21. The memory device of claim 13, wherein said device being adapted to determine whether said second set of fuses has been previously activated without using said enable fuse.

22. The memory device of claim 13, wherein said memory device further comprises:
an address override circuit to provide an address bus that is zeroed;
a global address comparison circuit operatively coupled to said address override circuit, said global address comparison circuit to assert an all-zero-address signal to disable said second fuse-set based upon said address bus being zeroed;
a standard fuse-set comparison unit operatively coupled to said global address comparison circuit, said standard fuse-set to assert a first match signal in response to a determination that said second set of fuses has not been previously activated based upon said all-zero-address signal;
a zero-enabled fuse-set comparison unit operatively coupled to said global address comparison circuit, said zero-enabled fuse-set comparison unit to assert a second match signal in response to a determination that said first set of fuses has not been previously activated;
a standard fuse-set availability unit to determine whether said second set of fuses is available to provide activation of said redundant memory portion based upon said first match signal; and
a zero-enabled fuse-set availability unit to determine whether said first set of fuses is available to provide activation of said redundant memory portion based upon said second match signal.

23. A memory device, comprising:
a first set of fuses for activating a first memory portion;
a second set of fuses for activating a second memory portion; and
a controller to control an operation of said first and second set of fuses, said controller to determine whether a zero address memory location relating to said first memory portion is to be activated based upon an enable fuse, said controller to also perform a check to determine whether said second set of fuses has been previously activated.

24. The memory device of claim 23, wherein said memory device is at least one of a static random access memory (SRAM), a dynamic random access memory (DRAM), a double-data rate SDRAM (DDR SDRAM), a DDR I device, a DDR III device, a Rambus DRAM (RDRAM), and a FLASH memory.

25. The memory device of claim 24, wherein said first set of fuses to provide access to a redundant memory portion of said memory device that corresponds to a first memory location address of zero.

26. The memory device of claim 25, wherein said second set of fuses to provide access to said redundant memory portion of said memory device that corresponds to a second memory location address.

27. The memory device of claim 23, wherein said controller to determine whether said zero address memory location associated with a memory portion of said device is defective.

28. The memory device of claim 23, wherein said first set of fuses comprises a plurality of zero-enabled fuses, said zero-enabled fuses comprising an electrical element that is activated in response to a determination that said memory address location of zero associated with a memory portion of said device is defective.

29. The memory device of claim 23, wherein said second set of fuses comprises a plurality of standard fuses.

30. The memory device of claim 23, wherein said device further comprises said enable fuse for performing a check to determine whether said first set of fuses has been previously activated.

31. The memory device of claim 30, wherein said device being adapted to determine that said first set of fuses is available based upon a determination that said first set of fuses has not been previously activated.

32. The memory device of claim 23, wherein said device being adapted to determine whether said second set of fuses has been previously activated without using said enable fuse.

33. The memory device of claim 23, wherein said device further comprises:
an address override circuit to provide an address bus that is zeroed;
a global address comparison circuit operatively coupled to said address override circuit, said global address comparison circuit to assert an all-zero-address signal to disable said second fuse-set based upon said address bus being zeroed;
a standard fuse-set comparison unit operatively coupled to said global address comparison circuit, said standard fuse-set to assert a first match signal in response to a determination that said second set of fuses has not been previously activated based upon said all-zero-address signal;
a zero-enabled fuse-set comparison unit operatively coupled to said global address comparison circuit, said zero-enabled fuse-set comparison unit to assert a second match signal in response to a determination that said first set of fuses has not been previously activated;
a standard fuse-set availability unit to determine whether said second set of fuses is available to provide activation of said redundant memory portion based upon said first match signal; and a zero-enabled fuse-set availability unit to determine whether said first set of fuses is available to provide activation of said redundant memory portion based upon said second match signal.

34. A system board, comprising:
a first device comprising a memory device for storing data, said memory device comprises:
a first redundant memory portion to provide redundancy to a first portion of said memory device;
a second redundant memory portion to provide redundancy to a second portion of said memory device;
a first set of fuses for activating said first redundant memory portion;
a second set of fuses for activating said second redundant memory portion; and
a controller to control an operation of said first and second set of fuses, said controller to determine whether a zero address memory location relating to said first memory portion is to be activated based upon an enable fuse, said controller to also perform a check to determine whether said second set of fuses has been previously activated; and
a second device operatively coupled to said first device, said second device to access data from said first device based upon an operation performed by memory device.

35. The system board of claim 34, wherein said memory device is at least one of an SRAM, a DRAM, a DDR SDRAM, a DDR I device, a DDR III device, a RDRAM, and a FLASH memory.

36. The system board of claim 34, wherein said system board is a motherboard of a computer system.

37. The system board of claim 34, wherein said first portion of said memory device corresponds to a memory location address of zero.

38. The system board of claim 34, wherein said controller to determine whether said zero address memory location associated with said memory portion of said device is defective.

39. The system board of claim 38, wherein said first set of fuses comprises a plurality of zero-enabled fuses, said zero-enabled fuses comprising an electrical element that is activated in response to a determination that said memory address location of zero associated with said memory portion of said device is defective.

40. The system board of claim 34, wherein said second set of fuses comprises a plurality of standard fuses.

41. The system board of claim 34, wherein said device further comprises said enable fuse for performing said check to determine whether said first set of fuses has been previously activated.

42. The system board of claim 41, wherein said device being adapted to determine that said first set of fuses is available based upon a determination that said first set of fuses has not been previously activated.

43. The system board of claim 34, wherein said device being adapted to determine whether said second set of fuses has been previously activated without using said enable fuse.

44. The system board of claim 34, wherein said memory device further comprises:
an address override circuit to provide an address bus that is zeroed;
a global address comparison circuit operatively coupled to said address override circuit, said global address comparison circuit to assert an all-zero-address signal to disable said second fuse-set based upon said address bus being zeroed;
a standard fuse-set comparison unit operatively coupled to said global address comparison circuit, said standard fuse-set to assert a first match signal in response to a determination that said second set of fuses has not been previously activated based upon said all-zero-address signal;
a zero-enabled fuse-set comparison unit operatively coupled to said global address comparison circuit, said zero-enabled fuse-set comparison unit to assert a second match signal in response to a determination that said first set of fuses has not been previously activated;
a standard fuse-set availability unit to determine whether said second set of fuses is available to provide activation of said redundant memory portion based upon said first match signal; and
a zero-enabled fuse-set availability unit to determine whether said first set of fuses is available to provide activation of said redundant memory portion based upon said second match signal.

45. A method, comprising:
associating a first redundant memory portion in a memory device with a first portion of said memory device;
associating a second redundant memory portion in said memory device with a second portion of said memory device;
associating a first set of fuses with said first redundant memory portion, said first set of fuses being adapted to activate said first set of redundant memory portion;
associating a second set of fuses with said second set of redundant memory portion, said second set of fuses being adapted to activate said second set of redundant memory portion; and
controlling an operation of said first and second set of fuses, controlling said operation comprising determining whether a zero address memory location relating to said first memory portion is to be activated based upon an enable fuse, and performing a check to determine whether said second set of fuses has been previously activated.

46. The method of claim 45, wherein associating a first set of redundant memory portion in said memory device with a first portion of said memory device further comprises associating said first portion of said memory device with a zero address memory location.

47. The method of claim 46, further comprising determining whether said memory address location of zero associated with a memory portion of said device is defective.

48. The method of claim 47, further comprising enabling said enable fuse for performing said check to determine whether said first set of fuses has been previously activated.

49. The method of claim 48, further comprising determining whether said first set of fuses is available based upon a determination that said first set of fuses has not been previously activated.

50. The method of claim 48, further comprises determining whether said second set of fuses has been previously activated without using said enable fuse.

* * * * *